(12) United States Patent
Cho

(10) Patent No.: US 10,582,623 B2
(45) Date of Patent: Mar. 3, 2020

(54) FLEXIBLE DISPLAY DEVICE

(71) Applicant: LG DISPLAY CO., LTD., Seoul (KR)

(72) Inventor: SeokHyo Cho, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/134,016

(22) Filed: Sep. 18, 2018

(65) Prior Publication Data
US 2019/0098775 A1    Mar. 28, 2019

(30) Foreign Application Priority Data

Sep. 28, 2017 (KR) ........................ 10-2017-0126545

(51) Int. Cl.
| | |
|---|---|
| H05K 7/02 | (2006.01) |
| H05K 7/04 | (2006.01) |
| H05K 5/00 | (2006.01) |
| H05K 5/02 | (2006.01) |
| H05K 5/03 | (2006.01) |
| H01L 51/52 | (2006.01) |
| G09F 9/30 | (2006.01) |
| H01L 51/00 | (2006.01) |
| G02F 1/1335 | (2006.01) |
| H01L 27/32 | (2006.01) |
| G02F 1/1333 | (2006.01) |

(52) U.S. Cl.
CPC .......... *H05K 5/0017* (2013.01); *G09F 9/301* (2013.01); *H01L 51/0097* (2013.01); *H01L 51/524* (2013.01); *H01L 51/5281* (2013.01); *H05K 5/0226* (2013.01); *H05K 5/03* (2013.01); *G02F 1/13338* (2013.01); *G02F 1/133305* (2013.01); *G02F 1/133308* (2013.01); *G02F 1/133528* (2013.01); *H01L 27/323* (2013.01); *H01L 27/3244* (2013.01); *H01L 2251/5338* (2013.01)

(58) Field of Classification Search
USPC ................................ 361/755, 809
See application file for complete search history.

(56) References Cited

U.S. PATENT DOCUMENTS

| | | | | |
|---|---|---|---|---|
| 10,164,208 B2 * | 12/2018 | Lee | ...................... | H01L 51/5253 |
| 10,168,734 B2 * | 1/2019 | Sun | ........................ | G06F 1/1618 |
| 2014/0003006 A1 * | 1/2014 | Ahn | ........................ | G06F 1/1652 |
| | | | | 361/749 |
| 2014/0029190 A1 * | 1/2014 | Sato | ........................ | G06F 1/1641 |
| | | | | 361/679.27 |
| 2015/0207102 A1 * | 7/2015 | Jeong | ................... | H01L 51/5256 |
| | | | | 257/40 |
| 2015/0370287 A1 * | 12/2015 | Ko | ........................ | G06F 1/1626 |
| | | | | 361/749 |
| 2016/0140882 A1 * | 5/2016 | Doebelt | ................... | G09F 9/301 |
| | | | | 361/749 |
| 2017/0168524 A1 * | 6/2017 | Kim | ........................ | G06F 1/1626 |
| 2017/0265317 A1 * | 9/2017 | Sun | ........................ | G09F 9/301 |
| 2018/0190936 A1 * | 7/2018 | Lee | ...................... | H01L 51/5253 |

* cited by examiner

*Primary Examiner* — Hung S. Bui
(74) *Attorney, Agent, or Firm* — Polsinelli PC

(57) ABSTRACT

The present disclosure provides a flexible display device in which a predetermined area of a display panel can be bent and returned to a plate state in use, depending the intention of a user, and that can provide touch sensing convenience of a user in the bent and divided area the display panel, because bending actuators bend and return a flexible display panel into a housing.

17 Claims, 8 Drawing Sheets

FLEXIBLE DISPLAY DEVICE

CROSS REFERENCE TO RELATED APPLICATION

This application claims priority from Korean Patent Application No. 10-2017-0126545, filed on Sep. 28, 2017, which is hereby incorporated by reference in its entirety for all purposes as if fully set forth herein.

BACKGROUND

Field of the Disclosure

The present disclosure relates to a display device and, more particularly, to a flexible display device in which a predetermined area of a display panel can be bent and returned to a flat plate state in use, depending on the intention of a user, and that can provide touch sensing convenience of a user in the bent and divided area of the display panel.

Description of the Background

In general, as flat display devices, a liquid crystal display device, a plasma display device, a field emission display device, and a light emitting display device etc. have been actively studied, but a liquid crystal display device and a light emitting display device have been spotlighted for the advantages of mass production technology, convenience of a driving device, and implementation of a high quality.

Recently, research and development about the structure of display products such as a rolling type and a folder type that can further appeal to customers are particularly increasingly required in addition to research and development about the technical defects of flat display devices. A display device shown in FIG. 1 includes a panel connector 3 connecting one panel 1 and another panel 2 to each other, in which the panel connector 3 includes a connecting surface 9, a guard plate 10, a molding 20, a packing 30, and a silicon 40.

However, since such a display device requires a specific part for connecting panels to fold the display panel, the structure becomes complicated and the number of parts is inevitably increased.

Further, one display panel is not bent, but separate display panels are connected through a connecting part, so the joint is exposed to the outside and deteriorates the external appearance. Further, the display panels are divided at the joints, so they cannot provide a continuous image.

Accordingly, further study for implementing a soft display without these problems is required.

SUMMARY

In this background, an aspect of the present disclosure to provide a flexible display device in which a predetermined section of a display panel can be bent and returned to a flat plate state in use, depending on the intention of a user.

Another aspect of the present disclosure is to provide a flexible display device that can provide touch sensing convenience in a predetermined bent and divided area of a display panel for a user.

Further, the aspect of the present disclosure is not limited thereto, and other unmentioned aspects of the present disclosure may be clearly appreciated by those skilled in the art from the following descriptions.

In accordance with an aspect of the present disclosure, there is provided a flexible display device in which a predetermined area of a display panel can be bent and returned to a plate state in use, depending on the intention of a user, and that can provide touch sensing convenience in the bent and divided area of the display panel for a user, because bending actuators bend and return a flexible display panel into a housing.

As described above, according to aspects of the present disclosure, a user can use a flexible display panel device with a predetermined section of a display panel bent and return the display panel in a flat plate type, if necessary.

Furthermore according to aspects of the present disclosure, it is possible to provide touch sensing convenience of a user to a bent and divided predetermined section of a display panel in a flexible display device.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
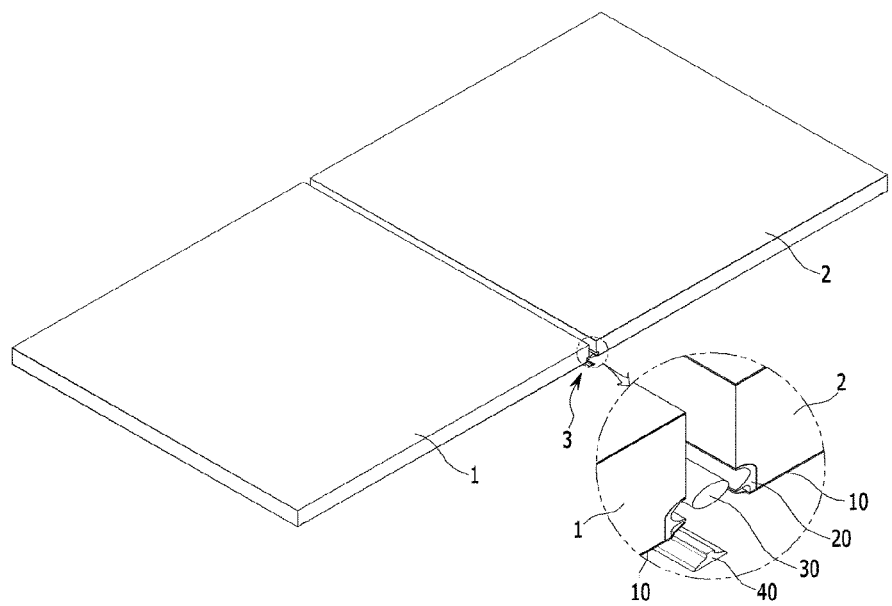
FIG. 1 is a perspective view schematically showing a display device of the related art.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 2:
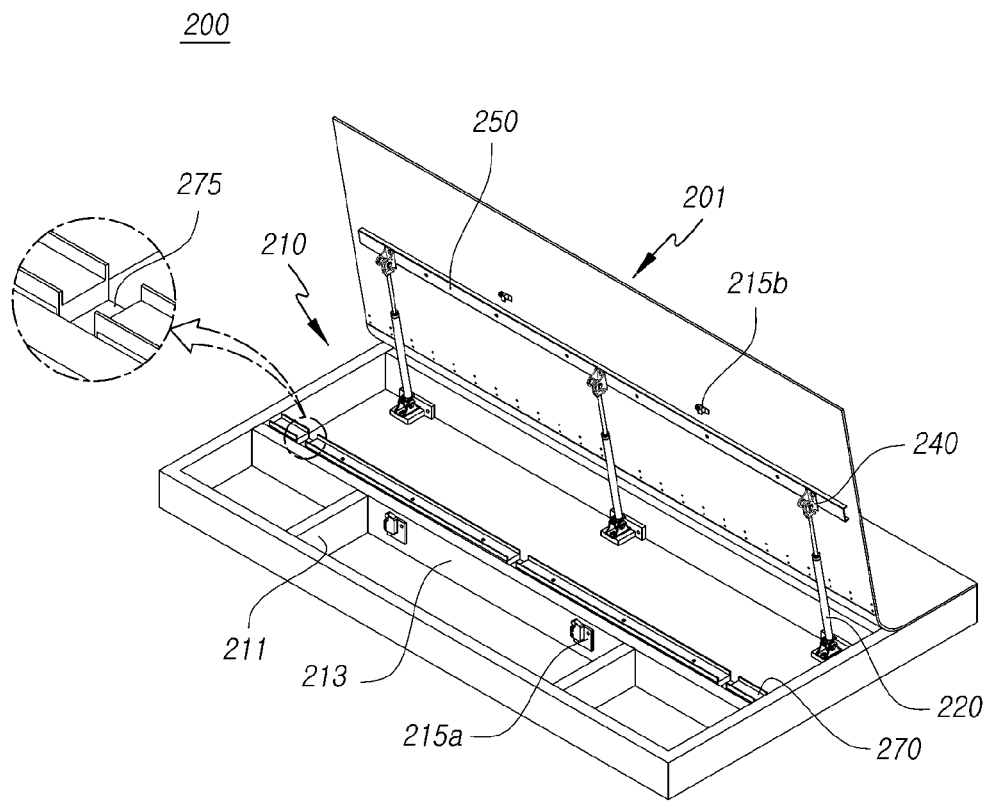
FIG. 2 is a perspective view showing a flexible display device according to aspects of the present disclosure.
Figure 3:
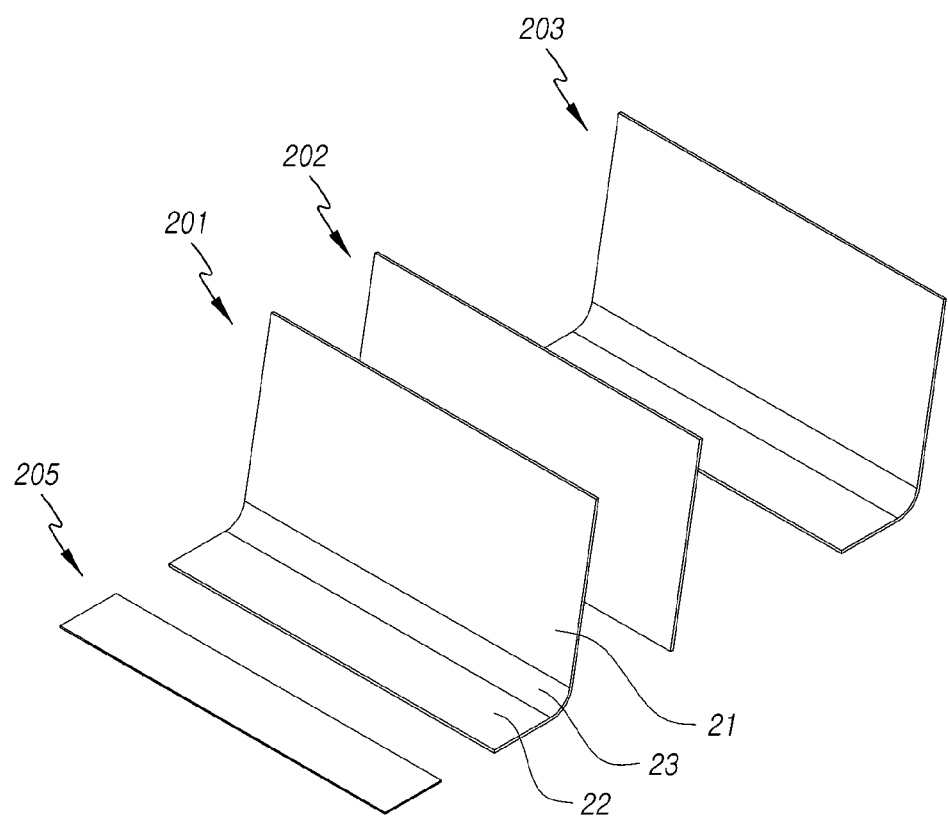
FIG. 3 is an exploded perspective view showing parts of a flexible display device according to aspects of the present disclosure.
Figure 4:
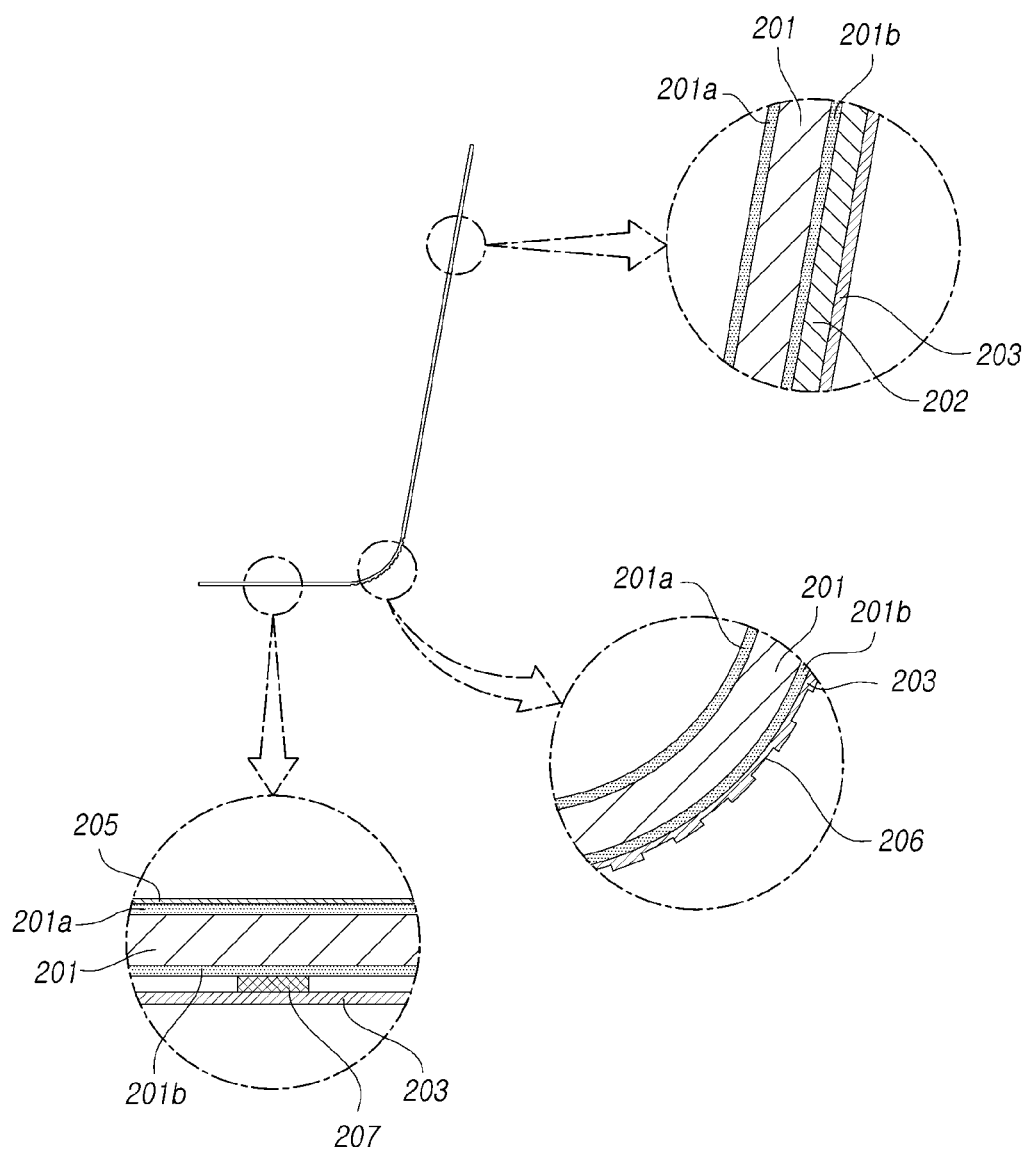
FIG. 4 is a cross-sectional view showing parts of a flexible display device according to aspects of the present disclosure.
Figure 5:
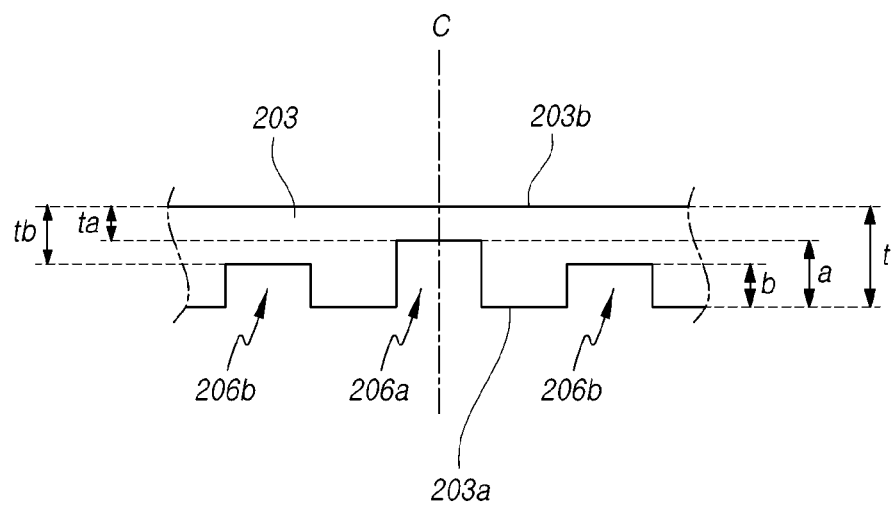
FIGS. 5 and 6 are cross-sectional views showing parts of a flexible display device according to aspects of the present disclosure.
Figure 6:
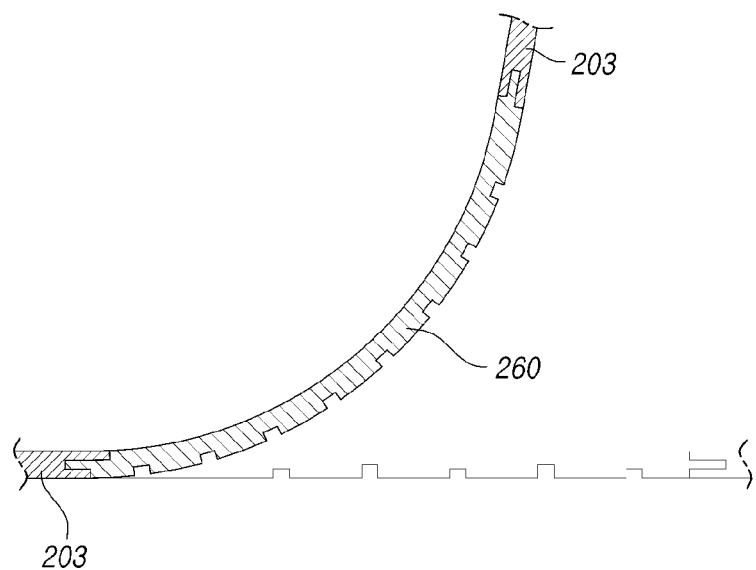
Figure 7:
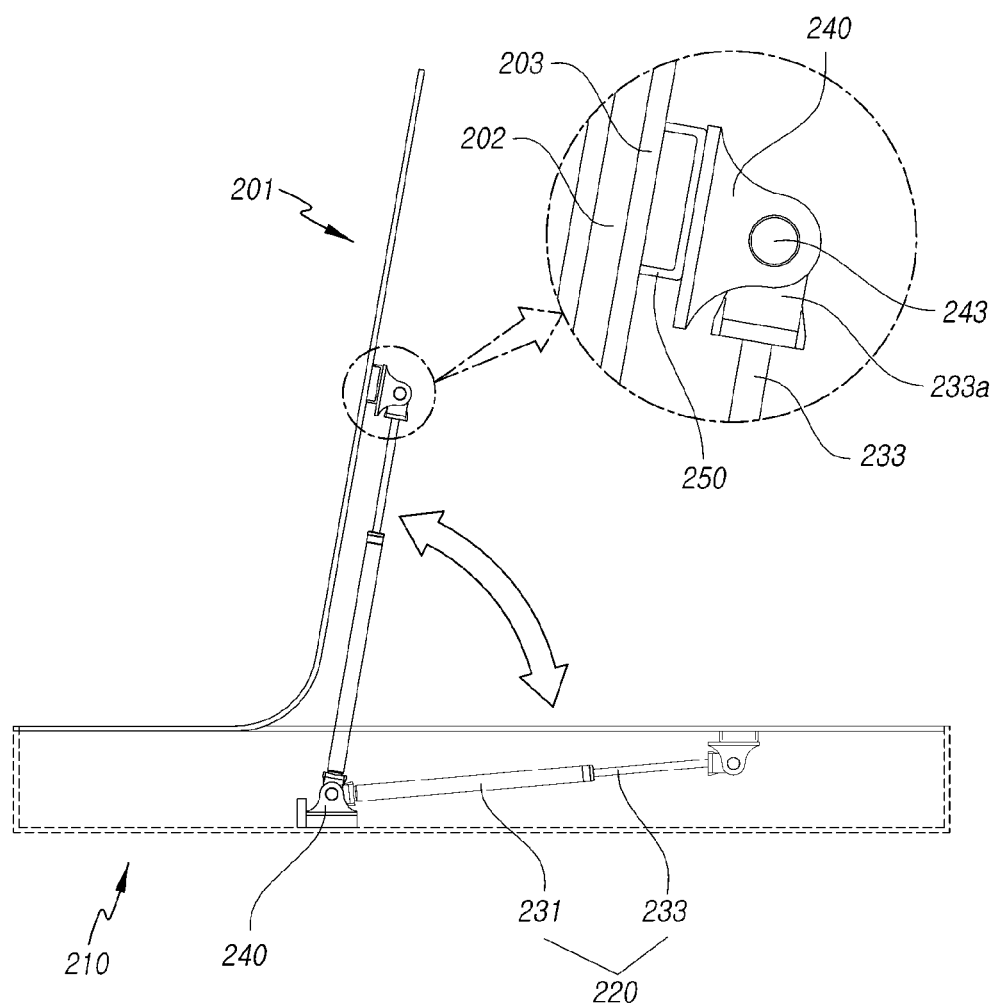
FIG. 7 is a view schematically showing the operation of the flexible display device according to aspects of the present disclosure.
Figure 8:
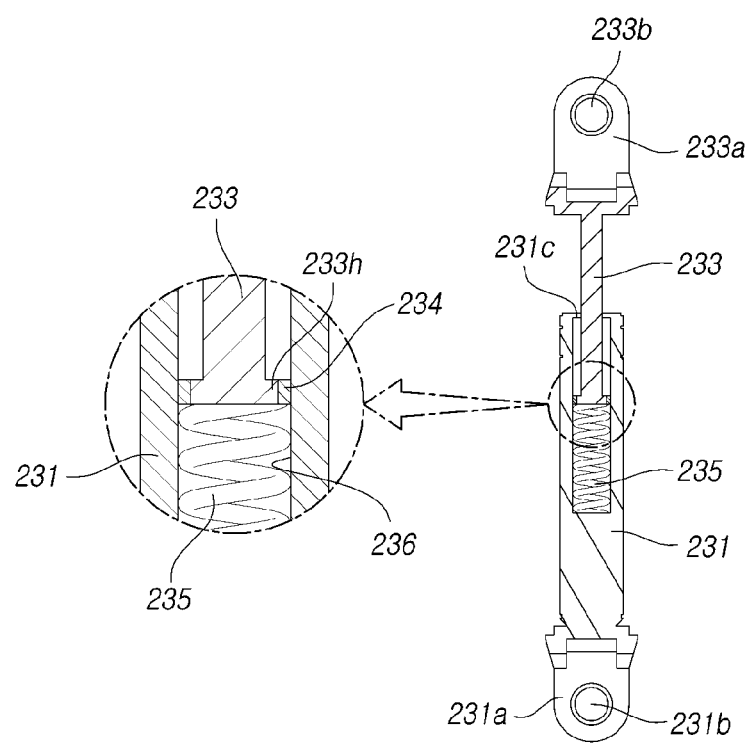
FIG. 8 is a cross-sectional view showing parts of a flexible display device according to aspects of the present disclosure.

FIG. 2 is a perspective view showing a flexible display device according to aspects of the present disclosure. FIG. 3 is an exploded perspective view showing parts of a flexible display device according to aspects of the present disclosure. FIG. 4 is a cross-sectional view showing parts of a flexible display device according to aspects of the present disclosure. FIGS. 5 and 6 are cross-sectional views showing parts of a flexible display device according to aspects of the present disclosure. FIG. 7 is a view schematically showing the operation of the flexible display device according to aspects of the present disclosure. FIG. 8 is a cross-sectional view showing some parts of a flexible display device according to aspects of the present disclosure.

As shown in the figures, a flexible display device 200 according to aspects of the present disclosure includes a flexible display panel 201 divided to have a joint section 23 being bendable and returnable between a first display section 21 and a second display section 22; a housing 210 accommodating the flexible display panel 201 and supporting the second display section 22 such that the first display section 21 and the joint section 23 can be bent and returned; and bending-actuators 220 each having a first end coupled to the first display section 21 and a second end coupled to the housing 210 to bend or return the first display section 21 and the joint section 23 by axially stretching and contracting.

The flexible display device 200 according to aspects of the present disclosure can be used with a predetermined section thereof bent and returned in a flat plate state by stretching and contracting of the bending-actuators 220, depending on the intention of a user. Further, a touch screen 205 is provided in a predetermined section of the display panel 210 to easily sense a touch by a user.

The display panel according to aspects is a flexible display panel for implementing the flexible display device 200 and can be applied to both of a liquid crystal display panel and a light emitting display panel.

When the flexible display panel 201 is a liquid crystal display panel, it may further include a backlight unit radiating light to the liquid crystal display panel, a lower polarizer attached to a lower substrate, and an upper polarizer attached to the front side of an upper substrate. The entire configuration of the lower substrate and the upper substrate can be implemented in various ways depending on the driving modes of the liquid crystal panel, for example, a Twisted Nematic (TN) mode, a Vertical Alignment (VA) mode, an In Plane Switching (IPS) mode, and a Fringe Field Switching (FFS) mode.

When the flexible display panel 201 is a light emitting display panel, the light emitting display panel may include a lower substrate having a plurality of light emitting cells in areas defined by gate lines, data lines, and power (VDD) lines, and an upper substrate attached to the lower substrate.

The light emitting cells on the lower substrate each may include at least one switching transistor connected to gate lines and data lines, at least one driving transistor connected to the switching transistor and a power line (VDD), and a light emitting device (e.g., an OLED) configured to emit light by a current that is controlled by switching of the driving transistor. Furthermore, the upper substrate may include a getter, which protects the light emitting devices from moisture or oxygen in the atmosphere, etc.

Light emitting devices connected to the driving transistors may be disposed on the upper substrate, and in this case, the light emitting devices on the lower substrate may be removed.

A light emitting display panel is exemplified and there is no backlight unit because it emits light by itself in aspects of the present disclosure, and it is assumed that the flexible display panel 201 is a light emitting display panel in the following description.

Organic compounds in the pixel array of the light emitting display panel can be deteriorated when they are exposed to moisture or oxygen, so, in order to solve the problem of deterioration of the pixels, the pixel array can be sealed by attaching a metallic encapsulation member 201b to the rear side of the flexible display panel 201.

A polarizing film 201a may be bonded to the front side of the flexible display panel 201.

Furthermore, in order to prevent light leakage that light from the pixel array comes out through sides, a side seal member made of a polymer containing black pigment may be disposed on the sides of the flexible display panel 201.

On the rear side of at least any one end of the flexible display panel 201 formed in a rectangular shape, a plurality of flexible circuit films each having an IC are electrically connected with the flexible display panel 201 an a printed circuit board.

The flexible circuit films are attached by to the flexible display panel 201 and the printed circuit board by resin through Tape Automated Bonding (TAB) and may be Tape Carrier Packages (TCP) or Chip On Flexible Boards or Chip On Films (COP).

Accordingly, the flexible display panel 201 is electrically jointed or connected to the printed circuit board through the flexible circuit films and the printed circuit board is electrically connected to the flexible circuit films, thereby providing various signals for displaying images to the flexible display panel 201.

The printed circuit board is electrically connected to the circuit films and provides various signals for displaying images to the flexible display panel 201 and a driving IC etc. for driving the flexible display panel 201 may be disposed on the printed circuit board.

In aspects of the present disclosure, the flexible display panel 201 is divided to be bent at the joint section 23 between the first display section 21 and the second display section 22, so the joint section 23 is bent and returned.

The housing 210 accommodating the flexible display panel 201 supports and fixes any one of the first display section 21 and the second display section 22 such that the other section is bent outside the housing 210 and returned when the joint section 23 is bent. In aspects of the present disclosure, it is exemplified that the housing 210 supports and fixes the second display section 22 such that the first display section 21 is bent outside the housing 210 and return.

The first ends of the bending-actuators 220 are coupled to the first display section 21 and the second ends of the bending-actuators 220 are coupled to the housing 210 to axially stretch and contract to be able to bend or return the first display section 21 and the joint section 23.

A touch screen panel 205 can be disposed on at least one of the first display panel 21 and the second display panel 22 of the flexible display panel 201. It is exemplified in aspects of the present disclosure that the touch screen panel 205 is disposed on the second display panel 22 and touch can be sensed through the second display panel 22 having the touch screen panel 205, so convenience for a user is improved.

That is, as the touch screen panel 205 is disposed on the second display section 22 fixed to the housing 210 in a flat plate shape, a user can use the first display section 21 as a monitor and the second display section 22 as an input device such as a keyboard by bending the first display section 21 in working, so convenience for the user is improved.

Furthermore, a back cover 203 that is bent with the joint section 23 is disposed on the rear side of the flexible display panel 201, so it is possible to prevent damage or deformation of the flexible display panel 201 due to physical shock from the outside even though the first display panel 21 is bent outside the housing 210.

Furthermore, a slot groove 206 recessed toward the inner side of the back cover 203 is formed on the rear side of the bending portion, which is bent with the joint section 23, of the back cover 203 so that the back cover 230 is easily bent while the slot groove 206 extends when the joint section 23 is bent.

A plurality of slot grooves 206 may be provided and spaced to both sides in a direction parallel with the joint section 23 and their depth may be decrease as they go to both sides from the center of the joint section 23.

That is, as shown in FIG. 5, the depth 'a' from the outer side 203a of the back cover of the slot groove 206a of the back cover 203 at the center of the joint section 23 is larger than the depth 'b' from the outer side 203a of the back cover of the next slot groove 206b, but the depth to to the inner side 203b of the back cover of the slot groove 206a at the center C of the joint section is smaller than the depth tb to the inner side 203b of the back cover of the next slot groove 206b.

Accordingly, when the joint section 23 is bent, the thickness of the back cover 203 at the center C of the joint section that is the most bent is minimized and the back cover 203 is easily bent. Further, since the thickness of the back cover 203 gradually increases toward both sides from the center C of the joint section, so the stiffness of the entire joint section 23 can be maintained.

The slot grooves 206 may be formed on the rear side of the back cover 203, but are not limited thereto, and as shown in FIG. 6, a separate bending connector 260 may be provided and connected to the back cover 203 at both ends thereof, which may be determined by the manufacturer in consideration of the material, thickness, and bending angle of the back cover 203.

On the other hand, a magnetic member 202 may be disposed between the rear side of the first display section 21 and the front side of the back cover 203 in the flexible display panel 201. The encapsulation member 201b and the back cover 203 that are made of a magnetic material and bonded to the rear side of the display panel 201 maintain the coupling force due to the magnetic member 202.

That is, when the first display panel 21 and the joint section 23 are bent and returned, the elastic expansion amount and expansion return amount of the back cover 203 is unavoidably larger than those of the flexible display panel 201 due to the thickness of the flexible display panel 201 and the back cover 203, so when the rear side of the first display section 21 and the front side of the back cover 203 of the flexible display panel 201 are fixed, the flexible display panel 201 may be broken.

Accordingly, by providing the magnetic member 202 between the rear side of the first display section 21 and the front side of the back cover 203 in the flexible display panel 201, the flexible display panel 201 and the back cover 203 can slide with respect to each other on the front side and the rear side of the magnetic member 202 during bending and returning, so deformation or breakage of the flexible display panel 201 can be prevented.

Furthermore, an adhesive member 207 is provided between the rear side of the second display section 22 and the front side of the back cover 203 of the flexible display panel 201, whereby it is possible to firmly fix the rear side of the second display panel 22 and the back cover 203 and prevent wrinkling in bending an returning.

That is, in the flexible display panel 201, the second display section 22 is firmly fixed with the back cover 203 regardless of bending and returning, while the first display section 21 can slip with respect to the back cover 203 by the magnetic member 202 when it is bent and returned. Accordingly, it is possible to prevent damage to the flexible display panel 201 due to elastic expansion of the back cover 203 in bending, and the flexible display panel 201 and the back cover 203 can return to the exact positions without wrinkling.

Furthermore, a support bar 250 is disposed laterally on the rear side of the back cover 203 in parallel with the joint section 23 and the first ends of the bending-actuators 220 are coupled to the support bar 250. Accordingly, the support bar 250 resists the force that is applied to the flexible display panel 201 when the bending-actuators 220 stretch and contract, thereby being able to prevent deformation or breakage of the flexible display panel 201.

The support bar 205 is fastened to the rear side of the flexible display panel 201 by fasteners and elongated toward both ends in the longitudinal direction of the flexible display panel 201, so the support bar 250 by the first ends of the bending-actuators 220 apply force to the support bar 250, the support bar 250 resists the force uniformly throughout the entire length.

On the other hand, the bending-actuators 220 each include a cylinder 231, a piston 233 reciprocating in the cylinder 231, and an elastic member 235 elastically supported between the piston 233 and the inside of the cylinder 231.

Accordingly, when a user pulls up the end of the first display section 21 to bend the first display section 21, the piston members 233 push out the piston member 233 with the elastic return force stretching the elastic member 235 from the contract state, so bending is automatically achieved.

Further, when a user pushes down the first display section 21 to use the first display section 21 in a flat plate type, the elastic members 235 contract and return.

A pair of locking members 215a and 215 be may be fixed respectively to the rear side of the flexible display panel 201 and a frame 213 in the housing 210 to maintain the first display panel 21 in a flat plate type. The locking members 215a and 215b may be a pair of magnets or a push open latch that is locked and unlocked by pushing.

The support bar 250 and the housing 210 each have hinge members 140 to rotatably connect ends of the piston 233 and the cylinders 231, so when the pistons 233 stretch and contract in the cylinders 231, the first display section 21 and the joint section 23 are bent.

Piston holes 233b are formed at first ends 233a of the piston 233 so that the pistons 233 can be coupled to the hinge members 240 by hinge pins 243 and cylinder holes 231b in which hinge pins 243 are inserted are also formed at first ends 231a of the cylinders 231, so the pistons 233 and the cylinders 231 are rotatably coupled the support bar 250 and the housing 210, respectively.

Furthermore, heads 233h are formed at second ends of the pistons 233 and are blocked to steps 231c formed at second ends of the cylinders 231 when the pistons 223 stretch and contract in the cylinders 231 so that the stretching length is limited. Furthermore, supporting members 234 may be fitted on outer side of the heads 233h to reduce noise and vibration by decreasing friction with the inner sides 236 of the cylinders 231.

The supporting members 234 may be ball bearings, roll bearings, pin bearings, or bushes.

The housing 210 in which the flexible display panel 201 is accommodated is formed in a rectangular shape and has transverse frames 213 and lengthwise frames 211 therein, so it is possible to prevent the housing 210 from twisting or breaking by maintaining the entire rigidity of the housing 210 even by repetitive bending and returning of the first display section 21.

The hinge members 240 connected to the bending-actuators 220 and the locking members 215a and 215b are coupled to the frames 211 and 213 in the housing 210, a seat member 270 where the support bar 250 is seated when the first display section 21 is returned in a flat plate type are coupled to the frames 211 and 213, and an insertion groove 275 in which the hinge members 240 coupled to the support bar 250 are inserted may be formed on the seat member 270.

Accordingly, the first display section 21 can be returned in close contact with the housing without protruding out of the housing 210, when it is returned in a flat plate type.

Although the aspects shown in the figures of the present disclosure were limited to a light emitting display panel, they can be applied to a liquid crystal display panel, in which a backlight module providing light to the liquid crystal display panel includes a light source module, a polarizer providing appropriate light to the liquid crystal panel by processing the light reflected by the light source module, a light adjuster, and a light reflector. The light source module is a part that converts electrical energy into light energy and it is apparent to those skilled in the art the light source module may be a Light Emitting Diode (LED) assembly, a Cold Cathode Fluorescent Lamp (CCFL), or a Hot Cathode Fluorescent Lamp (HCFL), so it is not described in detail herein.

As described above, according to aspects of the present disclosure, a user can use a flexible display panel device with a predetermined section of a display panel bent and return the display panel in a flat plate type, if necessary.

Furthermore according to aspects of the present disclosure, it is possible to provide touch sensing convenience of a user to a bent and divided predetermined section of a display panel in a flexible display device.

Even if it was described above that all of the components of an aspect of the present disclosure are coupled as a single unit or coupled to be operated as a single unit, the present disclosure is not necessarily limited to such an aspect. That is, at least two elements of all structural elements may be selectively joined and operate without departing from the scope of the present disclosure.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although an aspect of the present disclosure has been described for illustrative purposes, those skilled in the art will appreciate that various modifications, additions and substitutions are possible, without departing from the scope and spirit of the disclosure as disclosed in the accompanying claims. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A flexible display device comprising:
   a flexible display panel divided to have a joint section being bendable and returnable between a first display section and a second display section;
   a housing accommodating the flexible display panel and supporting the second display section such that the joint section is bendable and returnable;
   bending-actuators each having a first end coupled to the first display section and a second end coupled to the housing to bend or return the first display section and the joint section by axially stretching and contracting;
   a back cover bending with the joint section disposed on a rear side of the flexible display panel; and
   a support bar disposed on the rear side of the back cover, in parallel with the joint section, and the first end of the bending-actuators is coupled to the support bar.

2. The flexible display device of claim 1, further comprising a touch screen panel disposed on at least one of the first display section and the second display section to perform touch sensing.

3. The flexible display device of claim 1, wherein the back cover has a plurality slot groove recessed toward an inner side of the back cover, on the rear side of the back cover bendable with the joint section.

4. The flexible display device of claim 3, wherein the plurality of slot grooves is provided and spaced at both sides in a direction parallel with the joint section and the plurality of slot grooves is decreased in depth from a center of the joint section to both sides of the joint section.

5. The flexible display device of claim 1, further comprising a magnetic member disposed between a rear side of the first display section and a front side of the back cover of the flexible display panel.

6. The flexible display device of claim 5, further comprising an adhesive member disposed between a rear side of the second display section and the front side of the back cover of the flexible display panel.

7. The flexible display device of claim 1, wherein the bending-actuators each includes a cylinder, a piston reciprocating in the cylinder, and an elastic member elastically supported between the piston and an inside of the cylinder.

8. The flexible display device of claim 7, wherein the support bar and the housing each have hinge members to rotatably connect ends of the piston and the cylinder.

9. A flexible display device comprising:
   a flexible display panel divided into first and second display sections and a joint section, wherein the joint section is disposed between the first and second display sections and positioned between a bent state and a flat state;
   a polarization film disposed on the flexible display panel;
   a housing accommodating the flexible display panel and supporting the second display section to secure the bent state and the flat state;
   a bending-actuator having first and second ends, wherein the first and second end are respectively attached to the first display section and the housing and pushing and pulling the first display section and the joint section to be respectively in the bent state and the flat state through linear stretching and contracting movements;

a back cover bending with the joint section disposed on a rear side of the flexible display panel; and a support bar disposed on the rear side of the back cover, in parallel with the joint section, and the first end of the bending-actuators is coupled to the support bar.

10. The flexible display device of claim 9, further comprising a touch screen panel disposed on at least one of the first display section and the second display section to perform touch sensing.

11. The flexible display device of claim 9, wherein the back cover has a plurality slot groove recessed toward an inner side of the back cover, on the rear side of the back cover bendable with the joint section.

12. The flexible display device of claim 11, wherein the plurality of slot grooves is provided and spaced at both sides in a direction parallel with the joint section and the plurality of slot grooves is decreased in depth from a center of the joint section to both sides of the joint section.

13. The flexible display device of claim 9, further comprising a magnetic member disposed between a rear side of the first display section and a front side of the back cover of the flexible display panel.

14. The flexible display device of claim 13, further comprising an adhesive member disposed between a rear side of the second display section and the front side of the back cover of the flexible display panel.

15. The flexible display device of claim 9, wherein the bending-actuators each includes a cylinder, a piston reciprocating in the cylinder, and an elastic member elastically supported between the piston and an inside of the cylinder.

16. The flexible display device of claim 15, wherein the support bar and the housing each have hinge members to rotatably connect ends of the piston and the cylinder.

17. A flexible display device comprising:

a flexible display panel divided to have a joint section being bendable and returnable between a first display section and a second display section;

a housing accommodating the flexible display panel and supporting the second display section such that the joint section is bendable and returnable;

bending-actuators each having a first end coupled to the first display section and a second end coupled to the housing to bend or return the first display section and the joint section by axially stretching and contracting; and a back cover bending with the joint section disposed on a rear side of the flexible display panel, wherein the back cover has a plurality slot groove recessed toward an inner side of the back cover, on the rear side of the back cover bendable with the joint section, and wherein the plurality of slot grooves is provided and spaced at both sides in a direction parallel with the joint section and the plurality of slot grooves is decreased in depth from a center of the joint section to both sides of the joint section.

* * * * *